(12) United States Patent
Toriyama (10) Patent No.: US 9,240,222 B2
(45) Date of Patent: Jan. 19, 2016

(54) NON-VOLATILE SEMICONDUCTOR STORAGE DEVICE

(71) Applicant: Kabushiki Kaisha Toshiba, Minato-ku (JP)

(72) Inventor: Shuichi Toriyama, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/491,058

(22) Filed: Sep. 19, 2014

(65) Prior Publication Data

US 2015/0255122 A1    Sep. 10, 2015

(30) Foreign Application Priority Data

Mar. 6, 2014  (JP) .................. 2014-044000

(51) Int. Cl.
 *G11C 11/00* (2006.01)
 *G11C 5/06* (2006.01)
 *G11C 13/00* (2006.01)

(52) U.S. Cl.
 CPC .............. *G11C 5/06* (2013.01); *G11C 13/0002* (2013.01)

(58) Field of Classification Search
 USPC ........................................................ 365/148
 See application file for complete search history.

(56) References Cited

U.S. PATENT DOCUMENTS

| 7,910,914 | B2 | 3/2011 | Tanaka et al. |
| 2008/0093591 | A1 | 4/2008 | Khang et al. |
| 2008/0239800 | A1* | 10/2008 | Chen ...................... G11C 11/15 365/171 |
| 2011/0175048 | A1 | 7/2011 | Sekine et al. |
| 2012/0241712 | A1 | 9/2012 | Cai et al. |
| 2013/0148400 | A1 | 6/2013 | Murooka |

FOREIGN PATENT DOCUMENTS

| JP | 2008-103727 A | 5/2008 |
| JP | 2008-181978 A | 8/2008 |
| JP | 2011-146632 A | 7/2011 |
| JP | 2012-119499 A | 6/2012 |
| JP | 2013-120618 A1 | 6/2013 |

OTHER PUBLICATIONS

Ximeng Guan et al., "On the Switching Parameter Variation of Metal-Oxide RRAM—Part I: Physical Modeling and Simulation Methodology", IEEE Transactions on Electron Devices, vol. 59, No. 4, Apr. 4, 2012, pp. 1172-1182.

* cited by examiner

*Primary Examiner* — Hoai V Ho
(74) *Attorney, Agent, or Firm* — Oblon, McClelland, Maier & Neustadt, L.L.P.

(57) ABSTRACT

A non-volatile semiconductor storage device according to each of the embodiments includes a cell array that includes a plurality of first wires extending in a first direction, a plurality of second wires extending in a second direction crossing the first direction, and a plurality of memory cells each provided at an intersection between each of the first wires and each of the second wires. Each memory cell includes a variable resistance film of which resistance varies depending on a state of a filament in a medium. Each cell array has a first portion at which a distance between the first wire and the second wire is minimized and a second portion at which a distance between the first wire and the second wire is larger than the first portion at the intersection between each of the first wires and each of the second wires.

9 Claims, 8 Drawing Sheets

NON-VOLATILE SEMICONDUCTOR STORAGE DEVICE

CROSS-REFERENCE TO RELATED APPLICATIONS

This application is based upon and claims the benefit of priority from the prior Japanese Patent Application No. 2014-044000, filed on Mar. 6, 2014, the entire contents of which are incorporated herein by reference.

BACKGROUND

1. Field

The embodiments of the present invention relate to a non-volatile semiconductor storage device.

2. Description of the Related Art

In recent years, Resistive RAM (ReRAM) receives attention as a technology for realizing higher integration of a non-volatile semiconductor storage device.

The memory cell of the ReRAM uses a variable resistance film and can be formed into a cross-point type in which the memory cell is placed on the intersection of the selected lines. This causes the cell array to be a three-dimensional structure and thus can readily increase the ReRAM in capacity.

In order to implement the larger capacity, it is efficient as well as other memory systems to refine the cell array. However, the refinement of the cell array increases the electric/thermal interference among the selected lines or among the memory cells. Especially, when a variable resistance film of which resistance varies depending on the state of the filament in the medium is used for the memory cell, the increase in the electric/thermal interference generated between the filaments of the adjacent memory cells causes a malfunction.

DETAILED DESCRIPTION

A non-volatile semiconductor storage device according to each of the embodiments includes a cell array that includes a plurality of first wires extending in a first direction, a plurality of second wires extending in a second direction crossing the first direction, and a plurality of memory cells each provided at an intersection between each of the first wires and each of the second wires. Each memory cell includes a variable resistance film of which resistance varies depending on a state of a filament in a medium. Each cell array has a first portion at which a distance between the first wire and the second wire is minimized and a second portion at which a distance between the first wire and the second wire is larger than the first portion at each of the intersections between the first wires and the second wires.

Hereinafter, the non-volatile semiconductor storage device according to the embodiments will be described with reference to the appended drawings.

First Embodiment

First, an exemplary overall configuration of the non-volatile semiconductor storage device according to the first embodiment will be described.

Figure 1:
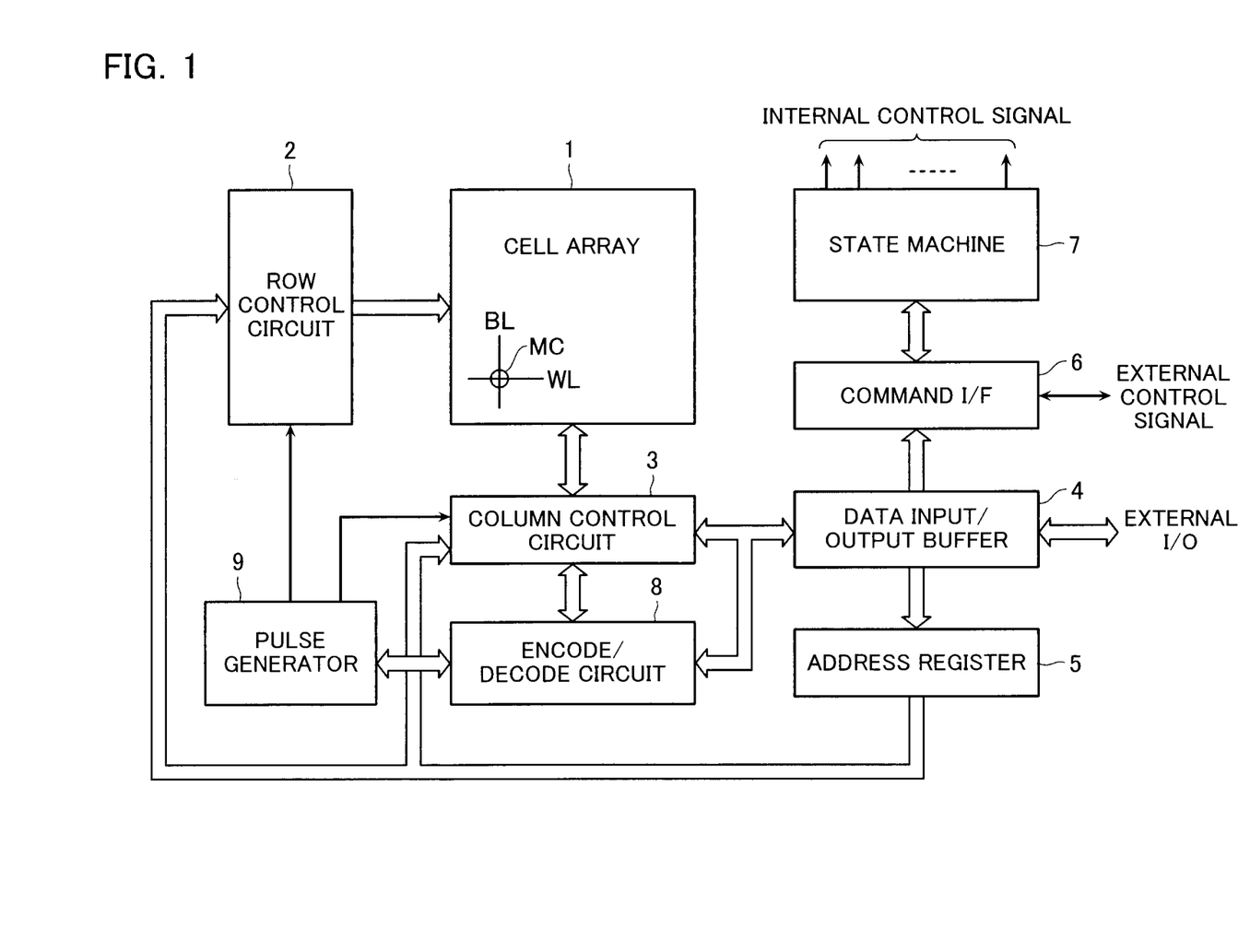
FIG. 1 is a functional block diagram of a non-volatile semiconductor storage device according to a first embodiment.

FIG. 1 is a functional block diagram of the non-volatile semiconductor storage device according to the present embodiment.

The non-volatile semiconductor storage device includes a cell array 1 including a plurality of word lines WL (the first wires), a plurality of bit lines BL (the second wires) crossing the word lines WL, and a plurality of the memory cells MC each provided on the intersection between each of the word lines WL and each of the bit lines BL.

A row control circuit 2 is provided at the position adjacent to the cell array 1 in the direction of the word line WL. The row control circuit 2 is configured to select a word line WL in the cell array 1 in order to apply a voltage necessary for the writing operation and reading operation to/from the memory cells MC.

A column control circuit 3 is provided at the position adjacent to the cell array 1 in the direction of the bit line BL. The column control circuit 3 is configured to control the bit lines BL in the cell array 1 in order to perform the writing operation and reading operation to/from the memory cells MC.

A data input/output buffer 4 is connected to an external host (not illustrated in the drawings) through an I/O line in order to receive the write data, output the read data, or receive the address data or command data. The data input/output buffer 4 transmits the received write data to the column control circuit 3 and receives the data read from the column control circuit 3 to output the data to the outside. The address supplied from the outside to the data input/output buffer 4 is transmitted through an address register 5 to the row control circuit 2 and the column control circuit 3. The command supplied from the host to the data input/output buffer 4 is transmitted to a command interface 6.

The command interface 6 receives the external control signal from the host and determines whether the data input to the data input/output buffer 4 is write data, a command, or an address. When the data is a command, the command interface 6 transfers the data as a reception command signal to a state machine 7.

The state machine 7 is configured to manage whole the non-volatile semiconductor storage device. The state machine 7 performs, for example, the reception of a command from the host, the writing operation, the reading operation, and the management of the input/output of the data.

The data input from the host to the data input/output buffer 4 is transferred to an encode/decode circuit 8 such that the output signal is input to the pulse generator 9. The pulse generator 9 outputs a write pulse at a predetermined voltage and a predetermined timing using the input signal. The pulse generated and output from the pulse generator 9 is transferred to arbitrary wires selected in the row control circuit 2 and the column control circuit 3.

Note that the row control circuit 2, the column control circuit 3, the data input/output buffer 4, the address register 5, the command interface 6, the state machine 7, the encode/decode circuit 8, and the pulse generator 9 are included in a data writing unit.

Next, a cell array 100 that is an example of the cell array 1 will be described in detail.

Figure 2:
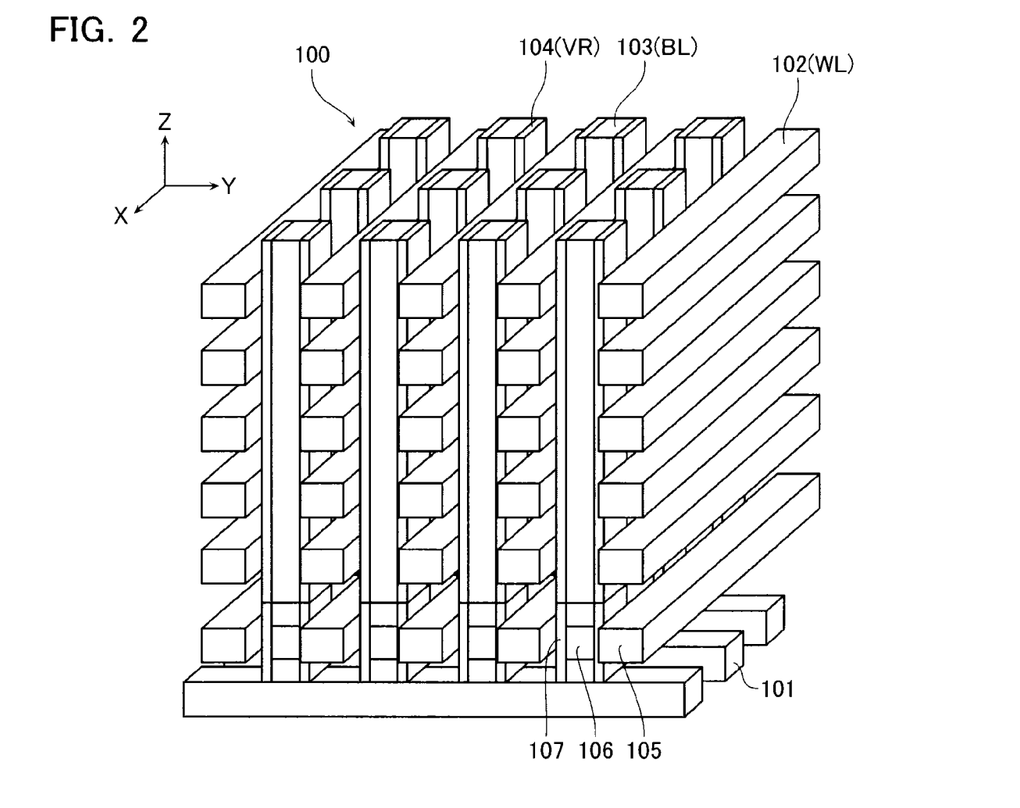
FIG. 2 is a perspective diagram of the cell array in the non-volatile semiconductor storage device according to the first embodiment.

FIG. 2 is a perspective diagram of the cell array in the non-volatile semiconductor storage device according to the present embodiment. FIG. 2 illustrates an X direction (first direction, a Y direction (third direction), and a Z direction (second direction) as three directions perpendicular to each other.

The cell array 100 having a three-dimensional structure includes a plurality of global bit lines 101 that are arranged in the X direction and that extend in the Y direction, and a plurality of word lines 102 (WL) that are arranged as two-dimensional arrays in the Y direction and the Z direction, that extend in the X direction, and that are made, for example, of TiN. The cell array 100 further includes bit lines 103 (BL) that are arranged as two-dimensional arrays in the X direction and the Y direction, that extend in the Z direction, and that are made, for example, of Poly-Si. When being viewed from the Z direction, each of the bit lines 103 is placed on a part of the global bit line 101 that is placed between the word lines 102 adjacent in the Y direction. A variable resistance film 104 (VR) is placed between each of the word lines 102 and each of the bit lines 103. The variable resistance film 104 is included in a memory cell at the intersection between each of the word lines 102 and each of the bit lines 103. The variable resistance film 104 is integrally formed among the memory cells adjacent to each other in the Y direction along the bit lines 103. Gate lines 105 extending in parallel with the word lines 102, silicon portions 106, and a selection devices including gate insulating films 107 are placed at the connections between the global bit lines 101 and the bit lines 103. The global bit line 101 and the bit lines 103 are electrically connected to each other through the selection devices.

Next, the operation of the memory cell in the cell array 100 will briefly be described.

Figure 3:
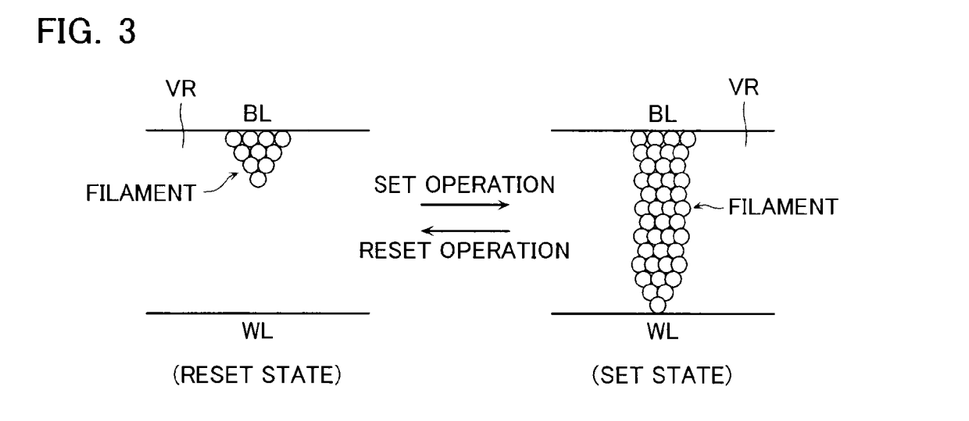
FIG. 3 is a diagram describing an operation of the memory cell in the non-volatile semiconductor storage device according to the first embodiment.

FIG. 3 is a diagram describing an operation of the memory cell in the non-volatile semiconductor storage device according to the present embodiment. FIG. 3 illustrates a region that is a low electric-resistance conducting portion, that is referred to as a "filament", and that extends from an electrode on the bit lines BL side.

The memory cell includes the variable resistance film 104. The variable resistance film 104 is made, for example, of a transition metal oxide such as $HfO_x$ or $TaO_x$. In that case, the filament is formed of oxygen vacancies obtained by the separation of the oxygen from the transition metal oxide.

The memory cell has at least two resistance states: a high-resistance state; and a low-resistance state. In the high-resistance state, the filament extending from the bit line BL side does not reach the electrode on the word line WL side. On the other hand, in the low-resistance state, the filament extending from the word line WL side reaches the electrode on the bit line BL side. Hereinafter, the high-resistance state is sometimes also referred to as a "reset state", and the low-resistance state is sometimes also referred to as a "set state". The operation for transition to the reset state is sometimes also referred to as a "reset operation", and the operation for transition to the set state is sometimes also referred to as a "set operation".

For convenience of simple description, the description above with reference to FIG. 3 explains that the filament physically contacts the electrode on the word line WL side in the low-resistance state and the filament does not physically contact the electrode in the high-resistance state. However, note that the low-resistance state and the high-resistance state are relatively be distinguished from each other only. For example, even when the filament does not physically contact the electrode on the word line WL side (is not in the state illustrated on the right of FIG. 3), the state can be deemed as the low-resistance state as long as the filament and the electrode on the word line WL side are physically closer to each than in the high-resistance state. Similarly, even when the filament physically contacts the electrode on the word line WL side (is in the state illustrated on the right of FIG. 3), the state can be deemed as the high-resistance state as long as the contact area is smaller than that in the low-resistance state.

To cause the memory cell to perform the set operation, a bias in which the potential of the word line WL is higher than the potential of the bit line BL is applied to the memory cell in the normal direction. Due to the electric field at that time, $O_x$ atoms in the variable resistance film VR separate as $O_x$ ions (negative charges) toward the word line WL side. As a result, the filament that includes vacancies obtained by the separation of the $O_x$ atoms in the variable resistance film VR extends toward the word line WL side. Then, the filament physically contacts or is physically close to the electrode on the word line WL side. This causes the memory cell to be in the set state.

On the other hand, to cause the memory cell to perform a reset operation, a bias, for example, a positive bias in which the potential of the bit lines BL is higher than the potential of the word lines WL is applied to the memory cell. Due to the electric field at that time, the $O_x$ ions bearing the negative charges are restored at the oxygen vacancies in the variable resistance film VR from the word line WL side. As a result, the top of the filament sufficiently separates from the electrode on the word line WL side. This causes the memory cell to be in the reset state.

Note that, in order to read the state of the resistance of the memory cell, for example, a bias that is not large enough to extend/contract the filament is applied to both ends of the variable resistance film 104 of the memory cell through the potential of the word line WL and the bit line BL. Then, detecting/amplifying the cell current flowing in the memory cell at that time using a sense amplifier included in the column control circuit 3 can read the state of the resistance of the memory cell.

In that case, the extension/contraction of the filament of the memory cell has the features described below.

Figure 4:
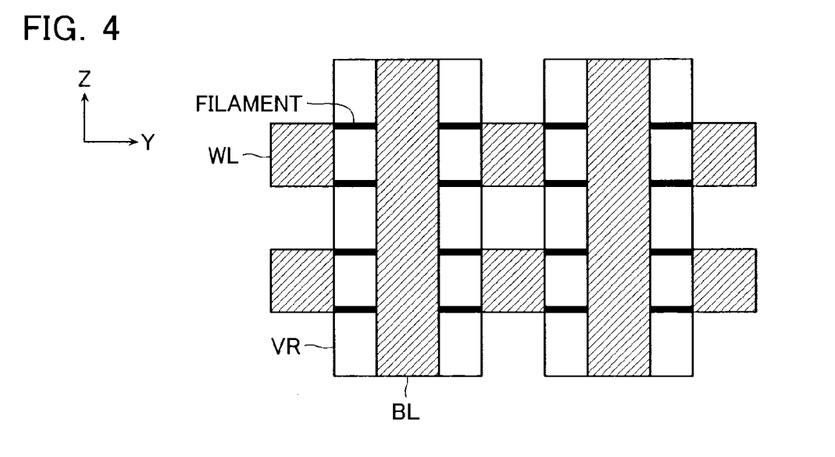
FIG. 4 is a cross-sectional diagram of the cell array in a non-volatile semiconductor storage device according to a comparison example to the first embodiment.
Figure 5:
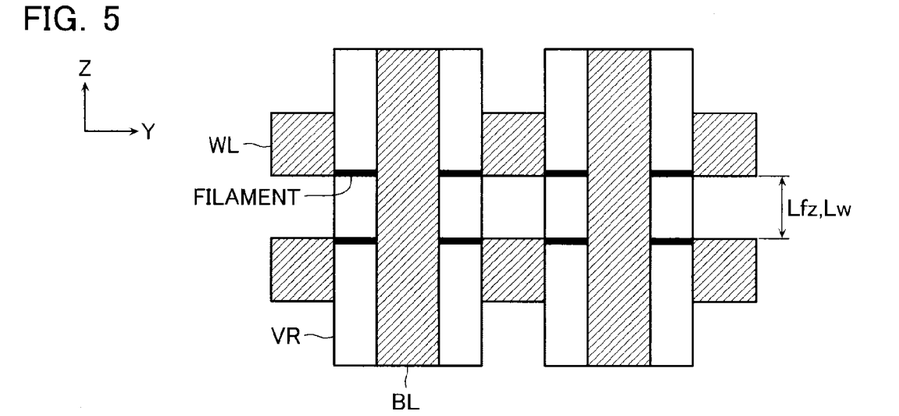
FIG. 5 is another cross-sectional diagram of the cell array in the non-volatile semiconductor storage device according to the comparison example to the first embodiment.
Figure 6:
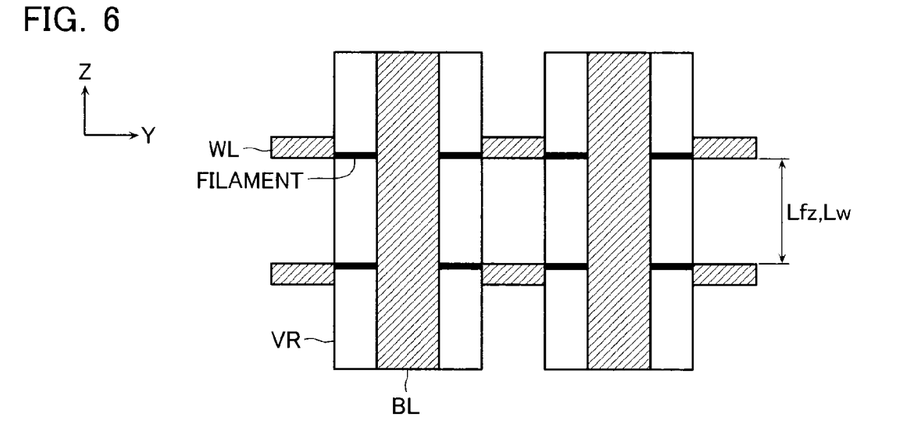
FIG. 6 is a cross-sectional diagram of the cell array in a non-volatile semiconductor storage device according to another comparison example to the first embodiment.

FIGS. 4 to 6 are cross-sectional diagrams of the cell array in a non-volatile semiconductor storage device according to a comparison example to the present embodiment.

When the variable resistance film VR has homogeneity, applying a bias to the memory cell for the above-mentioned operation concentrates the electric field generated by the bias on the end of the word line WL due to the end effect. The stronger the electric field is, more actively the $O_x$ ions separate from the variable resistance film VR to the word line WL side. This easily forms the filament on an edge of the word line WL, as illustrated in FIG. 4. At worst, a distance Lfz between the filaments of the memory cells adjacent to each other in the Z direction is reduced approximately to a minimum distance Lw between the word lines WL adjacent to each other in Z direction as illustrated in FIG. 5. Reducing the distance Lfz as described above increases the electric/thermal interference between the filaments. This causes a malfunction, for example, in which the resistance state of the memory cell is changed. To solve the problem, the word lines WL can be formed into a thin shape as illustrated in FIG. 6. This structure can increase the minimum distance Lw between the word lines WL to a distance wider than in FIG. 5. This also increases the distance Lfz between the filaments. However, in this structure, the power consumption increases because the resistance of the metal wire of the word lines WL increases.

In light of the foregoing, the present embodiment has the structure of the cell array 100 as described below.

Figure 7:
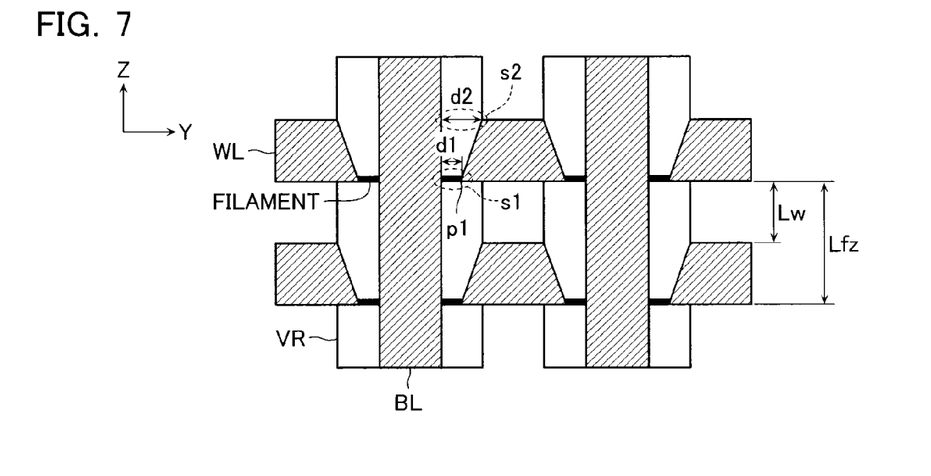
FIG. 7 is a cross-sectional diagram of the cell array in the non-volatile semiconductor storage device according to the first embodiment.

FIG. 7 is a cross-sectional diagram of the cell array in the non-volatile semiconductor storage device according to the present embodiment.

In the present embodiment, at least one of the word lines WL and the bit lines BL is formed so as to include a portion s1 in which the distance between the word line WL and the bit line BL is minimized, and a portion s2 in which a distance between the word line WL and the bit line BL is wider than the portion s1 at the intersection of each of the word lines WL and each of the bit lines BL. Note that a distance d2 at the portion s2 can merely be wider than a distance d1 at the portion s1. However, the maximum distance between the word line WL and the bit line BL will hereinafter be used for the description below.

In other words, differently from the comparison example, the distance between the word line WL and the bit line BL varies in the intersection of each of the word lines WL and each of the bit lines BL such that a portion in which the distance between the word line WL and the bit line BL is minimized and the variable resistance film VR has the thinnest thickness.

A concrete example of the above is a structure illustrated in FIG. 7. The structure illustrated in FIG. 7 includes the portion s1 at the position corresponding to the lower edge of the word line WL, the portion s2 at the position corresponding to the upper edge of the word line WL, and a protruding portion p1 protruding in the Y direction at the lower edge of the word line WL.

In the structure illustrated in FIG. 7, the Y-Z cross-section of the word line WL is formed into a trapezoidal shape of which lower base is longer than the upper base. This reduces the distance between the word line WL and the bit line BL and the thickness of the variable resistance film VR downward. In that case, the position corresponding to the lower edge of the word line WL is the minimum distance d1 and the position corresponding to the upper edge is the maximum distance d2.

Next, a process for forming the cell array 100 having the structure illustrated in FIG. 7 will be described.

FIGS. 8 to 14 are diagrams describing a process for forming the memory cell in the non-volatile semiconductor storage device according to the present embodiment.

Figure 8:
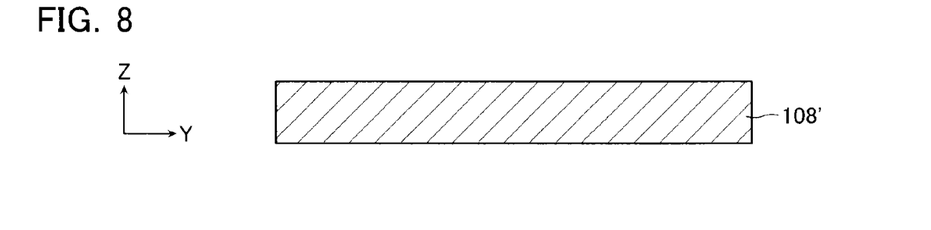
FIG. 8 is a diagram describing a process for forming the cell array in the non-volatile semiconductor storage device according to the first embodiment.

First, as illustrated in FIG. 8, a layer 108' that is to work as an interlayer insulating layer between the word lines WL is layered. The layer 108' is made, for example, of $SiO_2$.

Figure 9:
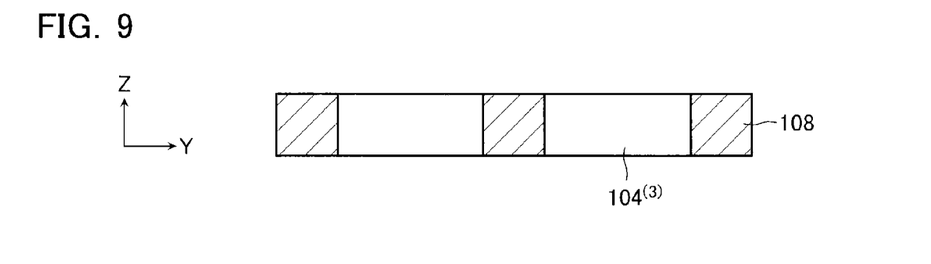
FIG. 9 is a diagram describing a process for forming the cell array in the non-volatile semiconductor storage device according to the first embodiment.

Next, as illustrated in FIG. 9, holes are formed on the layer 108' extending in the in Z direction with etching and then films $104^{(3)}$ that are to work as the variable resistance films VR are embedded in the holes. After that, the upper surfaces of the layer 108' and films $104^{(3)}$ are planarized with CMP.

Figure 10:
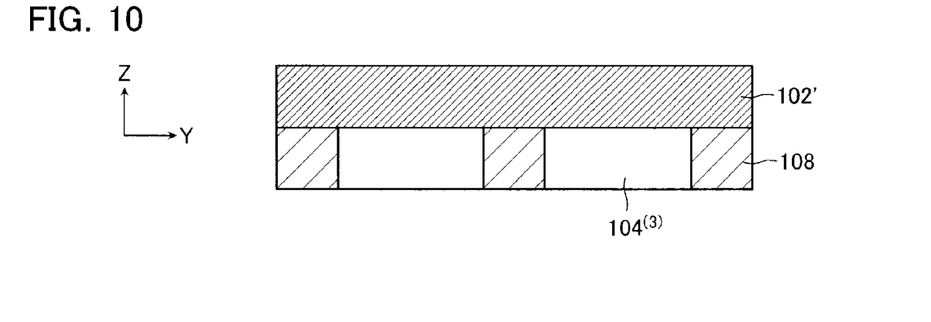
FIG. 10 is a diagram describing a process for forming the cell array in the non-volatile semiconductor storage device according to the first embodiment.

Next, as illustrated in FIG. 10, a layer 102' that is to work as the word line WL is layered on the layer 108' and films $104^{(3)}$. The layer 102' is made, for example, of TiN.

Figure 11:
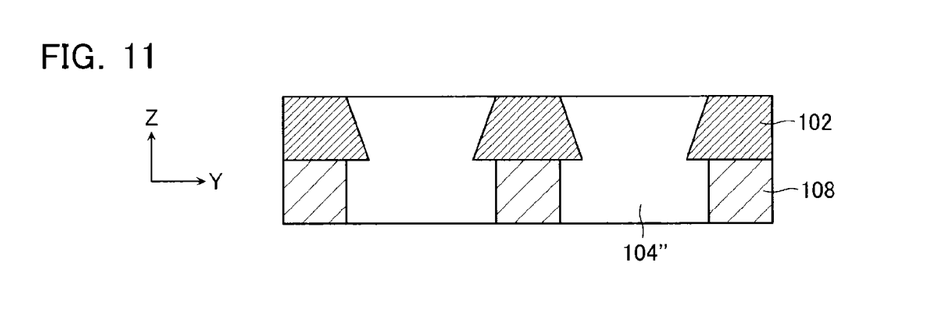
FIG. 11 is a diagram describing a process for forming the cell array in the non-volatile semiconductor storage device according to the first embodiment.

Next, as illustrated in FIG. 11, holes that extend in the Z direction and of which diameter decreases downward are formed on the layer 102' with etching, and films that are to work as the variable resistance films VR are embedded in the holes. In FIG. 11, the embedded films and the films that have been embedded in the process before this process and that are to work as the variable resistance films VR are collectively denoted with 104". After that, the upper surfaces of the layer 102' and the films 104" are smoothed with CMP. This process causes the layer 102' to be the word lines 102 (WL) on a layer.

Figure 12:
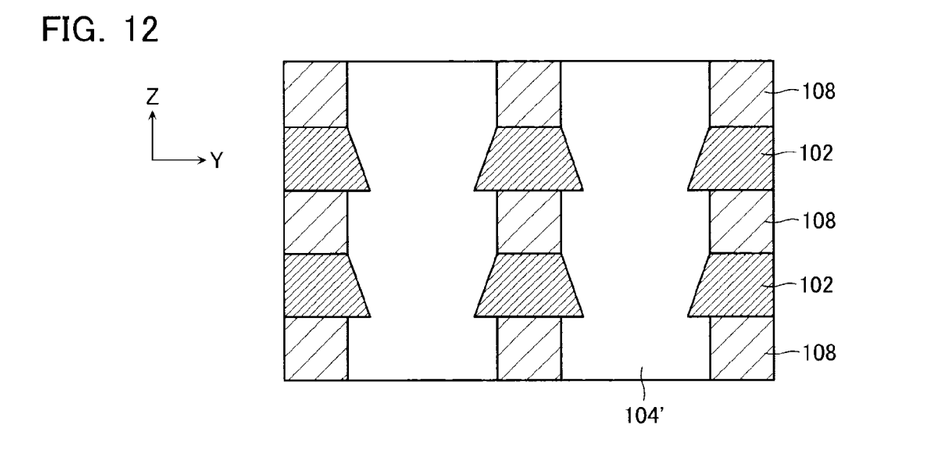
FIG. 12 is a diagram describing a process for forming the cell array in the non-volatile semiconductor storage device according to the first embodiment.

Next, as illustrated in FIG. 12, the processes illustrated in FIGS. 8 to 11 are repeated as necessary on the layer 102 and the films 104". In FIG. 12, the processes are repeated once. After that, the processes in FIGS. 8 and 9 are performed. The films that are embedded in the processes repeated in FIG. 12 and the films that have been embedded in the process before this process and that are to work as the variable resistance films VR are collectively denoted with 104' in FIG. 12.

Figure 13:
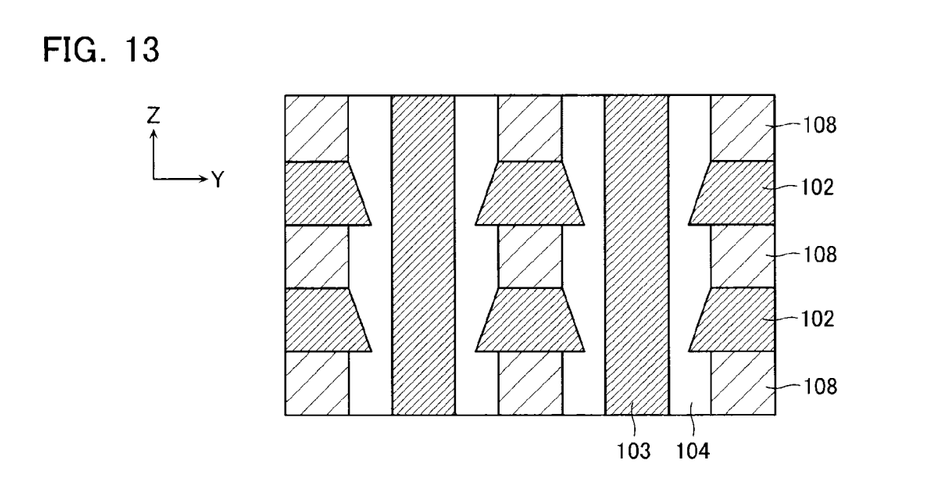
FIG. 13 is a diagram describing a process for forming the cell array in the non-volatile semiconductor storage device according to the first embodiment.

At last, as illustrated in FIG. 13, holes that extend in the Z direction are formed on the films 104' with etching. Films 103' that are to work as the bit lines BL are embedded in the holes. The films 103' are made, for example, Poly-Si. After that, the upper surfaces of the films 103' and 104', and the layer 108' are smoothed with CMP. This process causes the films 103' to be the bit lines 103 (BL) and causes the films 104' to be the variable resistance films 104 (VR).

The above are the processes for forming the cell array 100 having the structure illustrated in FIG. 7.

Next, an effect of the non-volatile semiconductor storage device according to the present embodiment will be described.

In the structure illustrated in FIG. 7, the Y-Z cross-section of the word line WL is formed into a trapezoidal shape of which lower bottom is longer than the upper bottom, and the protruding portion p1 is formed on the lower edge of the word line WL. In comparison with the examples in FIGS. 4 and 5, this can strengthen the concentration of the electric field on the lower edge while reducing the concentration of the electric field on the upper edge of the word line WL. Furthermore, the thickness of the variable resistance film VR is reduced at the position corresponding to the lower edge of the word line WL. This can regulate the position in which the filament is formed on the lower edge of the word line WL as illustrated in FIG. 7. This can increase the distance Lfz between the filaments of the memory cells adjacent to each other in the Z direction to a distance longer than the minimum distance Lw between the word lines WL adjacent to each other in the Z direction. In other words, the structure illustrated in FIG. 7 can reduce the electric/thermal interference between the filaments of the memory cells adjacent to each other in the Z direction to smaller in comparison with the example in FIG. 5. The structure illustrated in FIG. 7 does not seriously diminish the conductance of the word line WL as the example in FIG. 6 because the word lines WL still have the same thickness as the example in FIG. 5.

Furthermore, the structure illustrated in FIG. 7 causes the electric field to efficiently concentrate on the portion s1 and reduces the thickness of the variable resistance film VR at the portion s1. This can also provide the effect described below.

Figure 14:
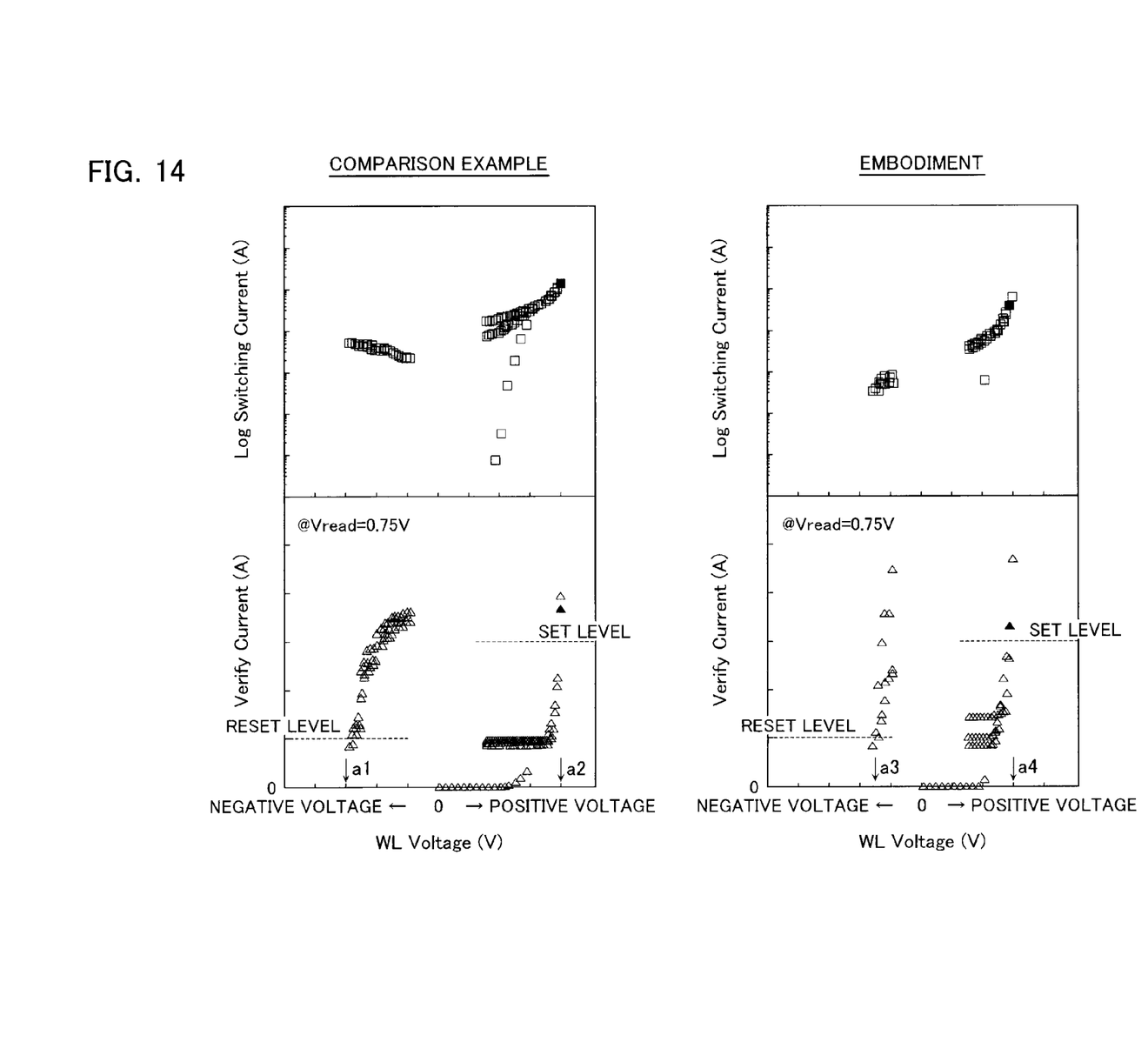
FIG. 14 is a diagram describing an effect of the cell array in the non-volatile semiconductor storage device according to the first embodiment.

FIG. 14 is a diagram describing an effect of the non-volatile semiconductor storage device according to the present embodiment. FIG. 14 illustrates the simulation result showing the relationship between the bias voltages applied to the memory cell during the repetition of the set operation and the reset operation, and the corresponding currents. The upper graphs in FIG. 14 show the switching currents during the set operation or the reset operation. The lower graphs in FIG. 14 show the verify currents during the verifying operations. Furthermore, the graphs on the left side of FIG. 14 show the comparison example in which the distance between the word line WL and the bit line BL and the thickness of the variable resistance film VR at each of the intersections are maintained at constant. The graphs on the right side of FIG. 14 show the present embodiment in which the distance between the word line WL and the bit line BL varies in order to form the portion s1 that is the minimum distance, and the thickness of the variable resistance film VR is reduced at the portion.

Note that in FIG. 14, the biases applied during the verifying operations in both of the embodiment and the comparison example are 0.75 V in common. In other words, the lower graphs in FIG. 14 mean that the verifying operations are performed at a bias of 0.75 V after the set operation and the reset operation are performed at the biases indicated on the horizontal axis, and do not mean that the verifying operations are performed while the biases indicated on the horizontal axis are applied to the variable resistance films 104. In FIG. 14, an arbitrary system of unit is used as the unit of each physical amount. However, the axes having the same name use the same scales.

In the cases illustrated in FIG. 14, it is determined that the memory cell is in the high-resistance state (the reset state) when the verify current flowing in the verifying operation is at a RESET level or less. It is determined that the memory cell is in the low-resistance state (the set state) when the verify current is at a SET level or more. According to the above, in the comparison example, it is necessary to apply a bias around the third scale on the negative side (the arrow a1 in FIG. 14) to the memory cell in order to change the state to the reset state. It is necessary to apply a bias around the fourth scale on the positive side (the arrow a2 in FIG. 14) to the memory cell in order to change the state to the set state. On the other hand, in the present embodiment, it is necessary to apply only a bias around the 1.5 scale on the negative side (the arrow a3 in FIG. 14) to the memory cell in order to change the state to the reset state. It is necessary to apply only a bias around the third scale on the positive side (the arrow a4 in FIG. 14) to the memory cell in order to change the state to the set state.

In other words, the structure in the present embodiment can cause the electric field to efficiently concentrate and can reduce the thickness of the film at the portion. This can cause the set operation and the reset operation of the memory cell with a bias smaller in comparison with the comparison example. As a result, this can reduce the power consumption in comparison with the comparison example.

Next, some exemplary variations of the present embodiment will be cited to mainly describe the different points from the structure illustrated in FIG. 7.

Figure 15:
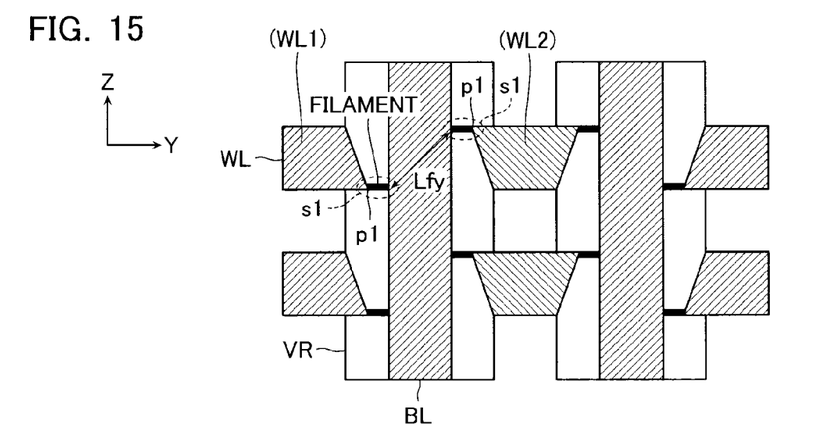
FIG. 15 is a cross-sectional diagram of another cell array in the non-volatile semiconductor storage device according to the first embodiment.
Figure 16:
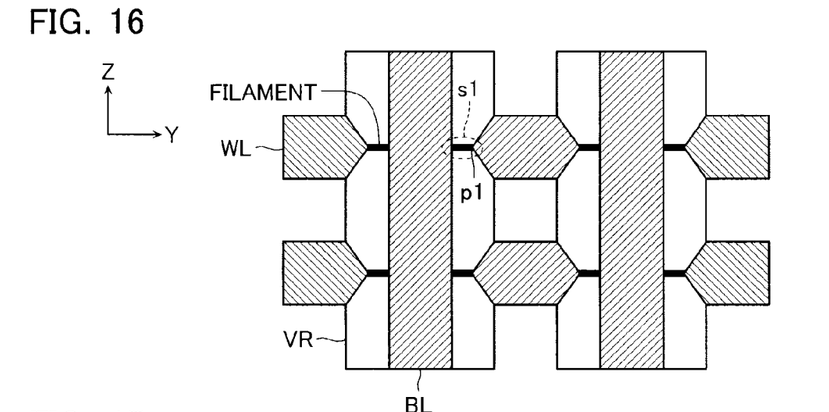
FIG. 16 is a cross-sectional diagram of another cell array in the non-volatile semiconductor storage device according to the first embodiment.
Figure 17:
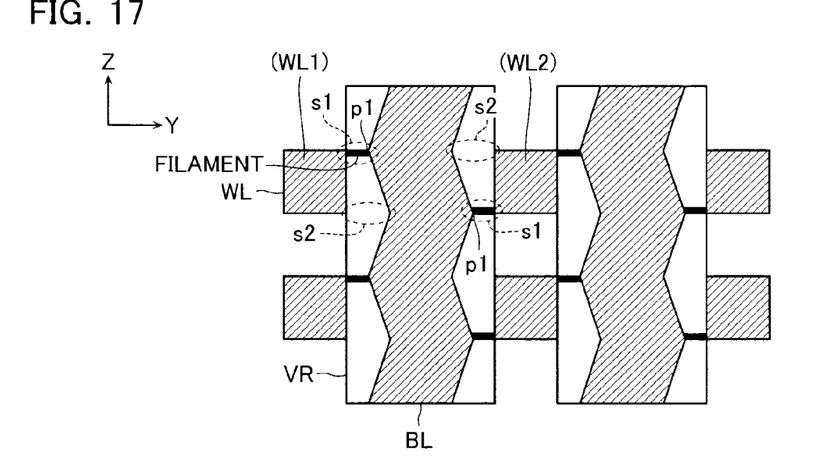
FIG. 17 is a cross-sectional diagram of another cell array in the non-volatile semiconductor storage device according to the first embodiment.

FIGS. 15 to 17 are cross-sectional diagrams of other cell arrays in non-volatile semiconductor storage device according to the present embodiment.

First, differently from the example in FIG. 7, the structure illustrated in FIG. 15 is an example in which the portions s1 are placed at different positions in the Z direction on the intersections among a bit line BL and the two word lines WL that hold the bit line BL therebetween and that are adjacent to each other in the Y direction. In the example, one of the two word lines WL that share the bit line BL and that are adjacent to each other in the Y direction and that is a word line WL1 has a Y-Z direction cross-section that is formed in a trapezoidal shape of which lower base is longer than the upper base. The other word line WL2, a Y-Z direction cross-section has a Y-Z direction cross-section that is formed in a trapezoidal shape of which upper base is longer than the lower base. In other words, one of the two word lines WL that hold the bit line BL therebetween end and that are adjacent to each other in the Y direction includes the protruding portion p1 at the lower edge, and the other includes the protruding portion p1 at the upper edge.

The structure illustrated in FIG. 15 can regulate the formation of the filament at the position corresponding to the lower edge of the word line WL1 at the intersection between the word line WL1 and the bit line BL, and can regulate the formation of the filament at the position corresponding to the upper edge of the word line WL2 at the intersection between the word line WL2 and the bit line BL. This can provide the same effect as the example in FIG. 7. The filament between the word line WL1 and the bit line BL is not formed in alignment with the filament between the word line WL2 and the bit line BL in the Z direction. This can increase the distance Lfy between the filaments of the memory cells adjacent to each other in the Y direction in comparison with the example in FIG. 7. In other words, this can reduce the electric/thermal interference between the filaments to smaller than the example in FIG. 7.

Next, differently from the example in FIG. 7, the structure illustrated in FIG. 16 is an example in which the portion s1 is placed at the center of the word line WL in the Z direction. In the example, the cross-section of the word line WL in the Y-Z direction is formed in a hexagonal shape having a wide center in the Z direction. In other words, the word line WL has a protruding portion p1 at the center in the Z direction.

The structure illustrated in FIG. 16 can regulate the formation of the filament at the center position of the word line WL. This can increase the distance Lfz between the filaments of the memory cells adjacent to each other in the Z direction to a distance wider than the minimum distance Lw between the word lines WL adjacent to each other in the Z direction, similarly to FIG. 7. In other words, even when the portion s1 is formed at the center position of the word line WL in the Z direction, the same effect as the example in FIG. 7 can be provided.

Note that, although being placed at the center position of the word line WL in the Z direction in the example in FIG. 16, the portion s1 and the protruding portion p1 can be placed at any intermediate position other than the upper and lower edges of the word line WL.

Finally, differently from the example in FIG. 7, the structure illustrated in FIG. 17 is an example in which the word lines WL do not include a protruding portion while the bit lines BL include protruding portions p1 each protruding in the Y direction. In the example, the cross-section of the bit line BL in the Y-Z direction includes a portion s1 that is the most convex portion on the upper edge, and a portion s2 that is the deepest concave portion on the lower edge of the word line WL on a word line WL1 side. The cross-section includes a deepest concave portion that is the portion s2 on the upper edge, and a most convex portion that is the portion s1 at the lower edge of the word line WL on a word line WL2 side. The word lines WL share a bit line BL and are adjacent to each other in the Y direction. In other words, the distance between the word line WL1 and the bit line BL decreases from the upper edge toward the lower edge of the word line WL1. The distance between the word line WL2 and the bit line BL decreases from the lower edge toward the upper edge of the word line WL2.

The structure illustrated in FIG. 17 can regulate the formation of the filament on the upper edge of the word line WL1 at the intersection between the word line WL1 and the bit lines BL, and can regulate the formation of the filament on the lower edge of the word line WL2 at the intersection between the word line WL2 and the bit lines BL. This can provide the same effect as in FIG. 7. Furthermore, in the structure illustrated in FIG. 17, the positions of the filaments of two memory cells that hold a bit line BL therebetween and that are adjacent to each other in the Y direction are different from each other in the Z direction. This can also provide the same effect as the example of FIG. 15.

Note that, although forming a protruding portion only at one of the word line WL and the bit line BL varies the distance between the word line WL and the bit line BL in the structure illustrated in each of FIGS. 15 to 17, the protruding portion can be formed at both of the word line WL and the bit line BL. Furthermore, all the examples in FIGS. 7, 15, 16, and 17 vary the distance between the word line and the bit line on the cross-section in the Y-Z direction. However, the distance between the word line WL and the bit line BL can be varied, for example, on the cross-section in the X-Y direction. The distance can be varied on any cross-section crossing the memory cell.

As described above, the present embodiment forms a protruding portion in each of the intersections and forms a portion in which the distance between the word line WL and the bit line BL decreases in order to reduce the thickness of the variable resistance film at the portion. This can reduce the electric/thermal interference of the filaments of the adjacent memory cells, and provide a non-volatile semiconductor storage device operating with low power consumption.

Second Embodiment

The second embodiment will be described using a cell array 200 as another example of the cell array 1.

First, whole the structure of the cell array 200 will be described.

Figure 18:
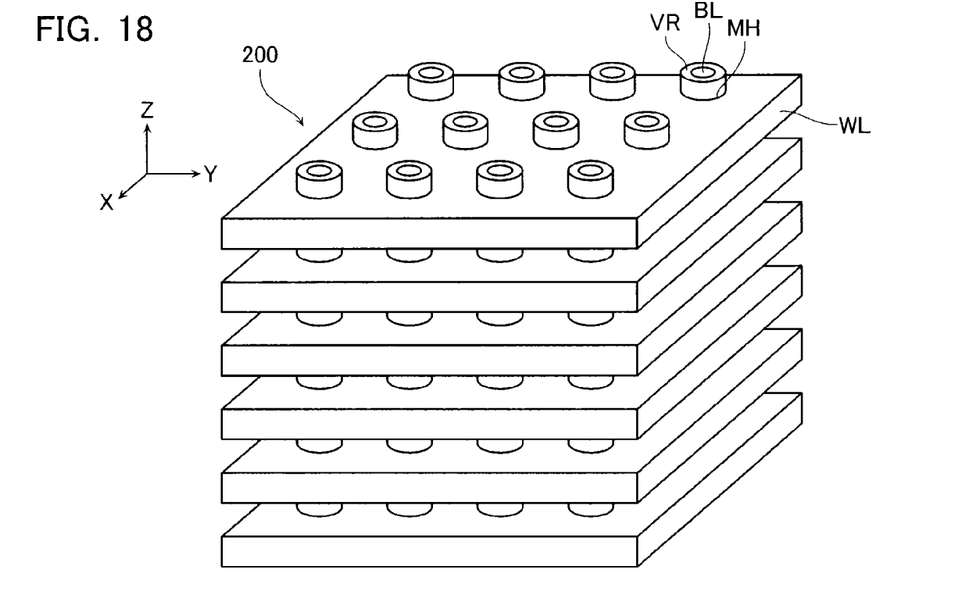
FIG. 18 is a perspective diagram of the cell array in a non-volatile semiconductor storage device according to a second embodiment.

FIG. 18 is a perspective diagram of the cell array in a non-volatile semiconductor storage device according to the second embodiment.

The cell array 200 has a three-dimensional structure, similarly to the cell array 100. The cell array 200 includes a plurality of planar word lines WL that are arranged in the Z direction and that each expand in the X direction and Y direction. A plurality of memory holes MH that are arranged in a two-dimensional array and that extend in the Z direction are formed on the word lines WL while penetrating the word lines WL. The cell array 200 further includes variable resistance films VR each formed on the inner surface of each of the memory holes MH, and columnar bit lines BL each formed on the inner surface of each of the variable resistance films VR.

Next, the position of the bit line BL relative to the word line WL in the cell array 200 will be described. Note that the present embodiment resolves the interference between the filaments in the X direction and Y direction, in other words, the filaments on a word line WL plane in FIG. 18 while the first embodiment resolves the interference between the filaments in the Z direction in FIG. 18.

Generally, the bit line BL is formed at the center of the memory hole MH on the word line WL. In that case, the position at which the filament is formed is not fixed because the intensity of the electric field between the word line WL and the bit line BL is almost the same on any parts of the side surface of the bit line BL. This sometimes reduces the distance between the adjacent filaments on the same word line WL plane depending on the positions of the filaments. This increases the electric/thermal interference between the filaments.

In light of the foregoing, the bit line BL is placed relative to the memory hole MH on the word line WL as described below in the present embodiment.

Figure 19:
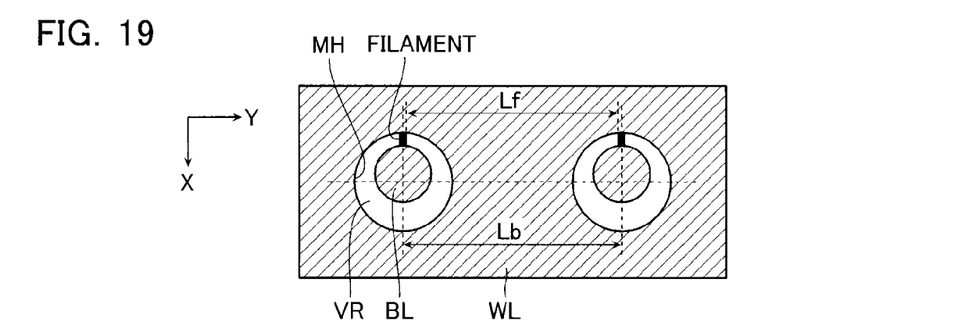
FIG. 19 is a cross-sectional diagram of the cell array in the non-volatile semiconductor storage device according to the second embodiment.

FIG. 19 is a cross-sectional diagram of a cell array of the non-volatile semiconductor storage device according to the present embodiment. FIG. 19 illustrates an example in which the cross-section of each of the memory hole MH and the bit line BL in the X-Y direction is formed in a circular shape.

In the structure illustrated in FIG. 19, the bit lines BL is placed not at the center of the memory hole MH but biased upward (toward one side of the X direction) from the center in the FIG. 19. This reduces the distance between the word line WL and the bit line BL at the position on the upper side of the bit line BL, and also reduces the thickness of the variable resistance film VR. This can efficiently concentrate the electric field on the position on the upper side of the bit line BL. This can regulate the position at which the filament is formed on the upper side of the bit line BL as illustrated in 19. Placing the bit lines BL at the same positions in the memory holes MH increases the distance Lf between the filaments in the memory holes MH adjacent to each other in the X direction or Y direction to the same as the positional distance Lb between the adjacent memory holes MH. This can reduce the electric/thermal interference between the filaments.

Figure 20:
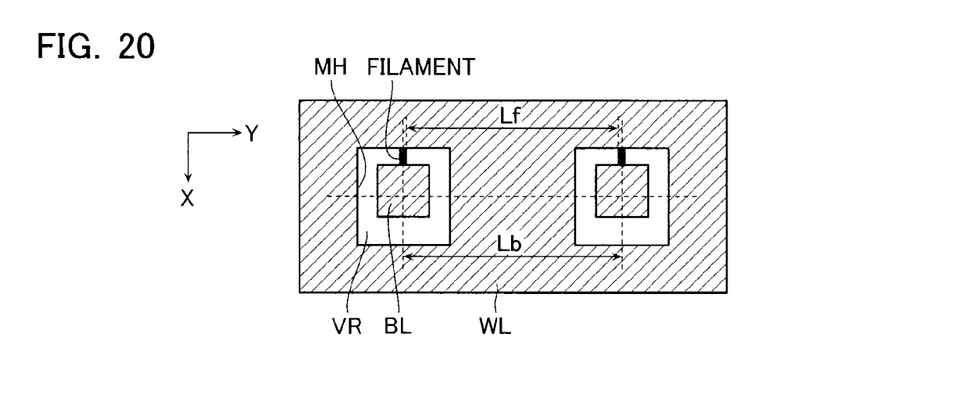
FIG. 20 is a cross-sectional diagram of another cell array in the non-volatile semiconductor storage device according to the second embodiment.

Note that the present embodiment is not limited to the case in which the cross-section of each of the memory hole MH and the bit line BL in the X-Y direction is formed in a circular shape. For example, even if the cross-section of each of the memory hole MH and the bit line BL in the X-Y direction has a rectangular shape as illustrated in FIG. 20, the bit line BL can be biased toward a desired position at which the filament is formed.

As described above, even if the cell array having the structure illustrated in FIG. 18 is used, biasing the bit line in the memory hole on the word line WL and reducing the thickness of the variable resistance film at the position can form the filament at an appropriate position at a low voltage. Thus, similarly to the first embodiment, the present embodiment can reduce the electric/thermal interference of the filaments of the adjacent memory cells, and provide a non-volatile semiconductor storage device operating with low power consumption.

OTHERS

Some of the embodiments of the present invention have been described above. The embodiments are cited as examples and are not intended to limit the scope of the invention. The novel embodiments can be implemented in other various modes and can variously be omitted, replaced, or changed without departing from the scope of the invention. The embodiments or the variations thereof are included in the scope or gist of the invention, and are also included in the invention described in claims and the equivalents thereof.

For example, an example in which the filament is formed of oxygen vacancies has been described in the embodiments. However, the embodiments are applied when conductive-bridging Ram (CBRAM) type ReRAM in which the filament is formed of metal atoms is used. Even at that case, in the same structure as described in each of the embodiments, the biased polarities in the set operation and reset operation are varied depending on the materials used for the word line, the bit line, and the variable resistance film. This can provide the same effects as the embodiments.

What is claimed is:

1. A non-volatile semiconductor storage device comprising:
    a cell array that includes a plurality of first wires extending in a first direction, a plurality of second wires extending in a second direction crossing the first direction, and a plurality of memory cells each provided at an intersection between each of the first wires and each of the second wires,
    each memory cell including a variable resistance film of which resistance varies depending on a state of a filament in a medium, and
    each cell array having a first portion at which a distance between the first wire and the second wire is minimized and a second portion at which a distance between the first wire and the second wire is larger than the first portion at the intersection between each of the first wires and each of the second wires.

2. The storage device according to claim 1, further comprising a semiconductor substrate, wherein
    the second direction is perpendicular to a main plane of the semiconductor substrate.

3. The storage device according to claim 1, wherein the first wires each include a protruding portion at the first portion in a third direction crossing the first direction and the second direction.

4. The storage device according to claim 1, wherein the second wires each include a protruding portion at the first portion in a third direction crossing the first direction and the second direction.

5. The storage device according to claim 1, wherein the first portion is placed at a position identical to an edge of the first wire in the second direction.

6. The storage device according to claim 1, wherein the first portion is placed at an intermediate position of the first wire in the second direction.

7. The storage device according to claim 1, wherein a distance between the first portions of two of the intersections adjacent to each other in the second direction is larger than a minimum distance between two of the first wires adjacent to each other in the third direction.

8. The storage device according to claim 1, wherein the first portions of two of the intersections that hold a second wire therebetween and that are adjacent to each other in the third direction are placed at different positions in the second direction.

9. The storage device according to claim 1, wherein the variable resistance films of the memory cells adjacent to each other in the second direction are integrally formed.

* * * * *